United States Patent
Dornhaus et al.

(10) Patent No.: US 8,362,771 B2
(45) Date of Patent: Jan. 29, 2013

(54) ESTABLISHMENT OF PARAMETERS TO ADJUST A MAGNETIC FIELD SHIM FOR A MAGNETIC RESONANCE EXAMINATION OF A PATIENT

(75) Inventors: Melanie Dornhaus, Frankfurt (DE); Stephan Kannengiesser, Wuppertal (DE)

(73) Assignee: Siemens Aktiengesellschaft, Munich (DE)

(*) Notice: Subject to any disclaimer, the term of this patent is extended or adjusted under 35 U.S.C. 154(b) by 463 days.

(21) Appl. No.: 12/687,958

(22) Filed: Jan. 15, 2010

(65) Prior Publication Data

US 2010/0182007 A1 Jul. 22, 2010

(30) Foreign Application Priority Data

Jan. 16, 2009 (DE) .......................... 10 2009 004 896

(51) Int. Cl.
*G01V 3/00* (2006.01)

(52) U.S. Cl. ....................................................... 324/309

(58) Field of Classification Search ........... 324/300–322
See application file for complete search history.

(56) References Cited

U.S. PATENT DOCUMENTS

| | | | |
|---|---|---|---|
| 4,761,614 A | 8/1988 | Prammer et al. | |
| 4,899,109 A * | 2/1990 | Tropp et al. | 324/320 |
| 5,523,688 A | 6/1996 | Heid et al. | |
| 6,064,208 A * | 5/2000 | Steckner | 324/320 |
| 6,545,476 B1 * | 4/2003 | Heid | 324/320 |
| 6,794,869 B2 * | 9/2004 | Brittain | 324/309 |
| 6,891,374 B2 * | 5/2005 | Brittain | 324/309 |
| 6,897,655 B2 * | 5/2005 | Brittain et al. | 324/309 |
| 7,145,338 B2 | 12/2006 | Campagna et al. | |
| 8,138,759 B2 * | 3/2012 | Greiser et al. | 324/309 |

\* cited by examiner

*Primary Examiner* — Dixomara Vargas

(74) *Attorney, Agent, or Firm* — Schiff Hardin LLP

(57) ABSTRACT

A fast, efficient, qualitatively high-grade shim is enabled in a magnetic resonance apparatus having a displaceable patient bed and an examination region of the patient that is to be examined is larger than an imaging region of the magnetic resonance apparatus. Field inhomogeneities are measured while the examination region is moved through the imaging region by a continuous displacement of the patient bed with the patient positioned thereon. Information representing field inhomogeneities is acquired at multiple positions of the patient bed from respective magnetic resonance signals received at these positions, by excitation of multiple respective slices before the readout of the echo of the first of these slices, with one echo train composed of multiple echoes being generated per excitation signal. Shim parameters of the magnetic resonance apparatus are adjusted dependent on the measured information.

14 Claims, 3 Drawing Sheets

ESTABLISHMENT OF PARAMETERS TO ADJUST A MAGNETIC FIELD SHIM FOR A MAGNETIC RESONANCE EXAMINATION OF A PATIENT

BACKGROUND OF THE INVENTION

1. Field of the Invention

The present invention concerns methods and devices to set shim parameters of a magnetic resonance apparatus to prepare the implementation of a magnetic resonance examination of a patient having an imaging medical magnetic resonance apparatus having a displaceable patient bed.

2. Description of the Prior Art

Magnetic resonance tomography is known from, for example, DE 102005019859 A1; "Floating Table Isotropic Projection (FLIPR) Acquisition: A Time-Resolved 3D Method for Extended Field-of-View MRI During Continuous Table Motion,". Fain, et al., Magnetic Resonance in Medicine 52: 1093-1 102 (2004); "Continuous Adjustment of Calibration Values for Improved Image Quality in Continuously Moving Table Imaging", Shankaranarayananl et al., Proc. Intl. Soc. Mag. Reson. Med. 11 (2004); U.S. Pat. No. 5,523,688; and "Helical MR: Continuously Moving Table Axial Imaging With Radial Acquisitions", Shankaranarayanan et al., Magnetic Resonance in Medicine 50: 1053-1060 (2003).

One goal of magnetic resonance tomography is to implement comprehensive patient examinations with increasingly shorter and stronger basic field magnets. The problem thereby occurs when larger body regions (the entire patient or non-contiguous regions) must be examined with an increasingly smaller imaging region due to the shorter basic field magnet. The magnetic resonance apparatuses (MR apparatuses) with short magnets, which are advantageous with regard to interventional questions and with regard to increased patient comfort, thereby pose new requirements for the workflow of an examination with such a magnetic resonance apparatus. The problem of the examination of an examination region that cannot be acquired with a local acquisition is solved by movement of the patient through the imaging region by means of a displaceable patient bed. The displacement can ensue in steps or continuously. In the former case, conventional, local acquisition techniques can be used.

However, the basic field of the magnet is altered by the patient depending on the location currently occupied by the patient due to movement of the patient bed. The field is thus altered differently at different positions of the patient bed, and therefore different positions of the patient located thereon. The basic field of the magnet is designated as B0; its variation is designated as field inhomogeneity.

The basic field should be homogenized by shimming (shim currents in shim magnets and gradient offsets) for the current position of the patient bed, and therefore of the patient located thereon.

For this purpose, the inhomogeneous basic magnetic field can be measured at the current position of the patient bed and the patient.

The measurement ensues as, for example, a gradient double echo imaging sequence in which the phase of the image is directly proportional to the field inhomogeneity. For a stationary measurement, the shim measurement is typically a 3D gradient echo sequence that runs for approximately 20 seconds. The shim parameters (shim settings) are only valid for a path of approximately 30 mm of the patient bed.

For an image acquisition given a continuous movement of the table, it is hardly practical to implement the conventional static measurement over a larger region in a spatially sufficient narrow grid. Particularly for oncological applications, the fat saturation is significant and this requires a good shim.

For a series of stationary measurements at many different, freely selectable positions of the patient bed, the frequent repetitions of stationary shim measurements likewise mean a marked extension of the total measurement time. Only static measurements at regular intervals of patient bed positions have previously been proposed for imaging with continuous table displacement (see the aforementioned article by Fain et al.).

SUMMARY OF THE INVENTION

An object of the present invention is to enable a temporally efficient, qualitatively high-grade shim for arbitrary individual positions of the patient bed and for measurements with continuous displacement of the patient bed over greater travel distances.

This object is achieved in accordance with the invention by a method to set shim parameters of a magnetic resonance apparatus to prepare the implementation of a magnetic resonance examination of a patient with an imaging medical magnetic resonance apparatus with a displaceable patient bed with the following features.

Field inhomogeneities are measured while the examination region is varied by a continuous displacement of the patient bed with the patient positioned thereon through the imaging region, so information representing field inhomogeneities is acquired at multiple positions of the patient bed from the respective received magnetic resonance signals.

Information representing field inhomogeneities is acquired by excitation of multiple respective slices before the readout of the echo of the first of these slices, and wherein one echo train comprising multiple echoes is generated per excitation signal.

Shim parameters of the magnetic resonance apparatus are adjusted dependent on the measured information, A magnetic resonance examination of the examination region is implemented with the apparatus shimmed according to the shim parameters.

A magnetic resonance apparatus according to the invention has a patient bed that can be continuously displaced during the measurement, a measurement device to implement a measurement at multiple positions of the continuously displaceable patient bed of magnetic resonance signals that can respectively be received at these positions, from which information representing field inhomogeneities can be obtained, an excitation device to excite multiple respective slices of the patient before the readout of the echo of the first of these slices, and to generate one echo train comprising multiple echoes per excitation signal, a device to set shim parameters of the magnetic resonance apparatus under consideration of specific information pertaining to field inhomogeneities, a device to implement a magnetic resonance examination of the examination region.

An advantage of the invention is that information pertaining to field inhomogeneities can be efficiently obtained in a relatively short amount of time for a plurality of positions of the patient on the travel path of the patient bed in the magnetic resonance apparatus, based on which information shim parameters can be effectively adjusted in order to optimize the imaging.

According to one embodiment of the invention, the patient bed with the patient positioned thereon is continuously shifted through the imaging region, and information representing field inhomogeneities is obtained. The patient bed with the patient positioned thereon is subsequently shifted again through the imaging region and a magnetic resonance examination of the examination region is thereby implemented with shim parameters of the magnetic resonance apparatus that are continuously adjusted under consideration of measured information. Alternatively, stationary examinations can be conducted in an analogous manner at arbitrary positions of the patient bed.

According to a further embodiment of the invention, a basic magnetic field distribution, radio-frequency magnetic field distribution and/or gradient magnetic field distribution is/are determined depending on the position of the patient bed.

According to a further embodiment of the invention, depending on the position of the patient bed respective parameters to adjust a magnetic field shimming at this position are generated under consideration of information representing field inhomogeneities determined at this position.

An additional embodiment enables the measurement of field inhomogeneities during a movement of the patient bed, and immediately following this the calculation and adjustment of shim parameters as well as the immediate imaging at the same position of the patient bed.

DESCRIPTION OF THE PREFERRED EMBODIMENTS

Figure 1:
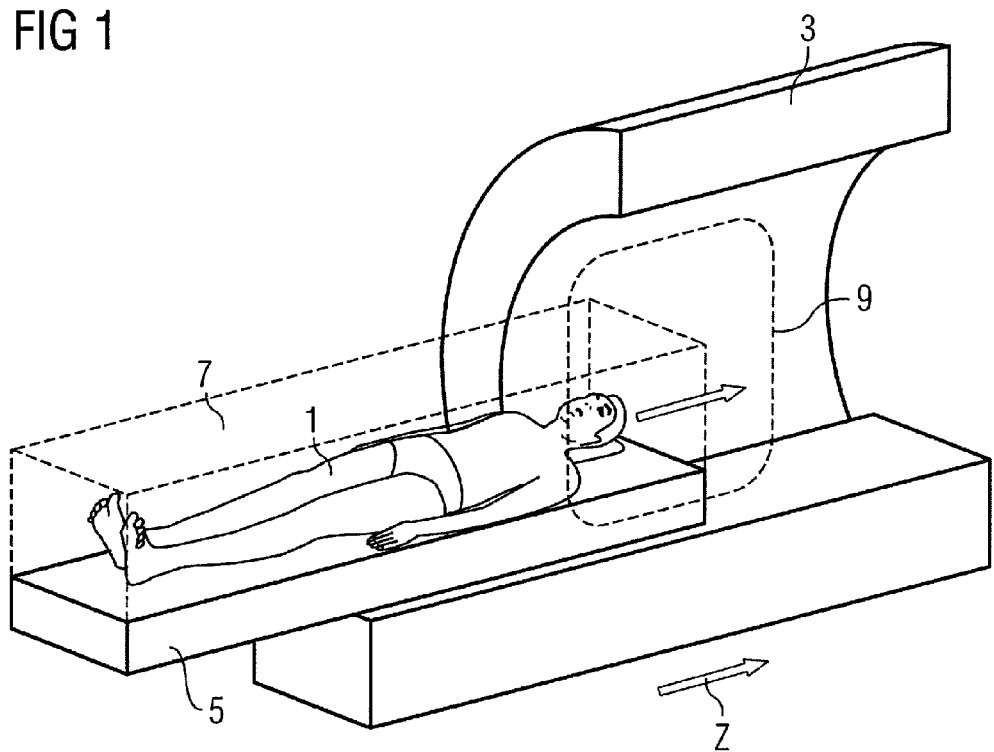
FIG. 1 schematically illustrates a magnetic resonance apparatus to implement the inventive method.

Using a flow chart, FIG. 1 shows an exemplary workflow of the method according to the invention. A patient 1 should be "non-locally" examined with the aid of a magnetic resonance apparatus 3 that possesses a displaceable patient bed 5. "Non-locally" hereby means that an examination region 7 is larger than an imaging region 9 (for example the region that could be at maximum be acquired by a single acquisition) of the magnetic resonance apparatus 3. To acquire the entire examination region 7, the patient is driven through the imaging region 9 of the magnetic resonance apparatus 3 on the patient bed 5 in the Z-direction, i.e. in the axial direction.

The examination of the patient 1 ensues according to the following workflow. First a positioning of the patient 1 on the patient bed 5 occurs. Under the circumstances, local radio-frequency coils are thereby also positioned on the body of the patient. The examination region 7 is possibly established.

To prepare the implementation of an imaging magnetic resonance examination of a patient (1) with the imaging medical magnetic resonance apparatus (3), before the acquisition of the planned images of the patient the magnetic field in the magnetic resonance apparatus 3 is optimized by what is known as (active) "shim".

"Shim" (or "shimming") is a process to homogenize the basic magnetic field in the magnetic resonance apparatus via measurement of field inhomogeneities ("B0 map"=B0 magnetic field map) in the magnetic resonance apparatus 3 (here given patient 1 in the magnetic resonance apparatus 3, said patient 1 being moved continuously with the patient bed 5) under adaptation of shim parameters—for example of shim currents (in shim coils used for shimming) and gradient offsets—based information acquired via measurement.

Given continuous displacement of the patient bed 5 (with the patient 1 positioned thereon) through the imaging region 9, information representing field inhomogeneities (B0 map) is thereby obtained at multiple positions of the patient bed from magnetic resonance signals respectively acquired during these positions.

For example, the patient is thus driven with the patient bed once through the magnetic resonance apparatus 3 to measure the B0 magnetic field information, and for imaging (thus under generation of images of the patient in the examination region 7) the patient is subsequently driven again through the magnetic resonance apparatus 3 whose (basic) magnetic field is then continuously optimized (is made more uniform) for the respective position of the patient 1 and the patient bed 5 in the magnetic resonance apparatus 3 with shim parameters determined based on the information during the movement of the patient with the patient bed through the magnetic resonance apparatus 3.

Alternatively, it would be conceivable that the patient is driven through the magnetic resonance apparatus 3, and information based on which shim parameters are determined is measured from the patient given traversal of the magnetic resonance apparatus 3 and at least one imaging (acquisition of an image) is then already implemented at a respective position with magnetic field optimized (shimmed) via these shim parameters.

Figure 2:
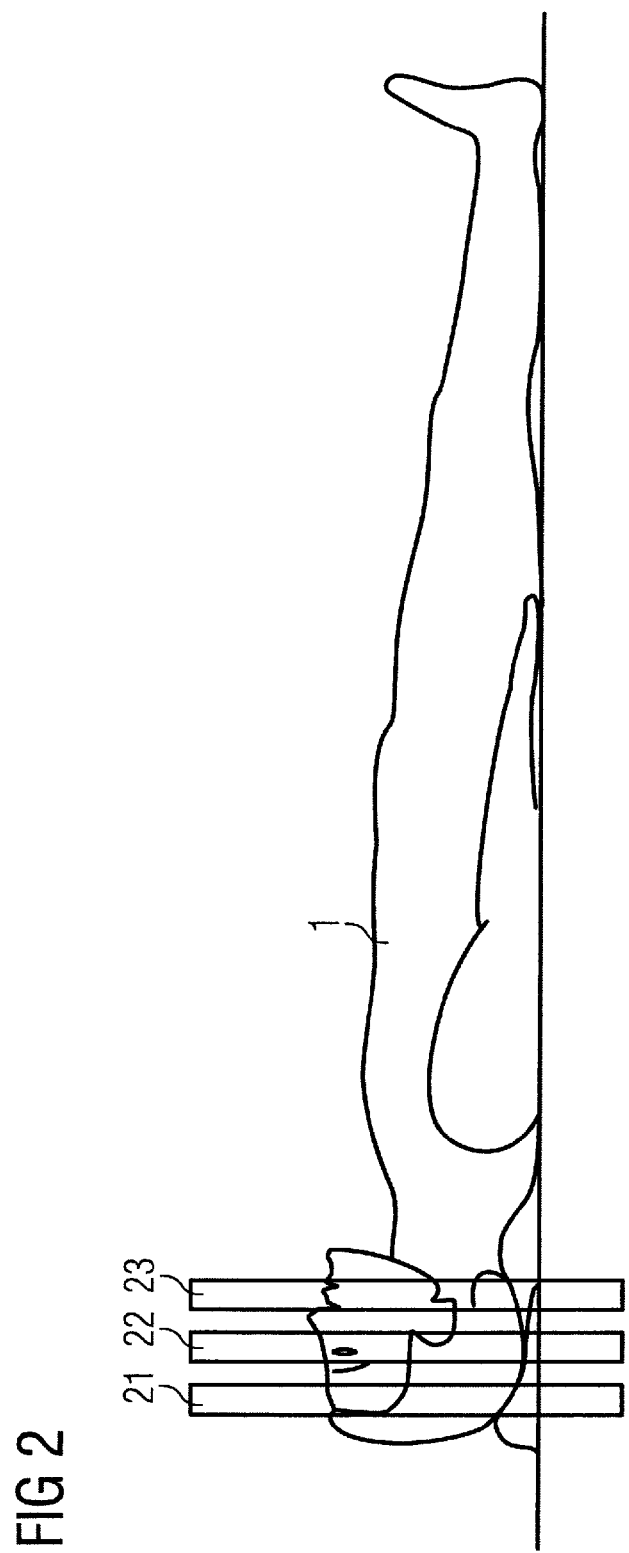
FIG. 2 shows the measurement of information representing field inhomogeneities in multiple approximately disc-shaped slices of the patient simultaneously at a position of a patient bed.

FIG. 2 shows, for a current table position, the measurement of information representing field inhomogeneities (B0 map) in N (at least two, here three) slices 21, 22, 23 of the patient simultaneously.

Three slices 21, 22, 23 in the patient that are read out simultaneously are shown as examples in FIG. 2. Here the slice profiles are advantageously selected so that short exciting pulses are possible.

A similar "interleaved TE" technique has already been used for the imaging itself, but not for shimming as here. In contrast to the "TE interleaved" technique that was developed for long echo times and individual echoes, here (for the determination of shim parameters) short, multiple echo times and small image matrices can be used; therefore acceptable times for the patient are enabled for the traversal of the magnetic resonance apparatus 3.

Multiple (in particular 3-5) slices can be excited (see FIG. 2) before the echo of the first of these discs must be detected.

If multiple slices (see FIG. 2) are excited and a multiple excitation of the slices ensues, the information required for a shim can be acquired in approximately 14 ms with a tested example apparatus for a double echo of 3 excited slices, wherein 43 phase coding steps ensue given a desired table speed of 50 mm per second, which is sufficient.

The generation of one echo train composed of multiple echoes per excitation signal ("multiple echo times") is also known in applications other than for the shim implemented here, namely in imaging with medical magnetic resonance apparatuses. For example, a turbo SE sequence generates, per excitation (with 90° etc., for example), not only a spin echo but also an entire series of echoes (an echo train). Every echo of the echo train receives a different phase coding (gradient pulse) and fills a line of the raw data matrix given imaging in medical magnetic resonance apparatuses (see "Magnete, Spins und Resonanzen, Eine Einführung in die Grundlagen der Magnetresonanztomographie" ["Magnets, Spins and Resonances: an Introduction to the Foundations of Magnetic Resonance Tomography"], Siemens AG 2003).

Information representing field inhomogeneities (B0 map) is thereby obtained by excitation of multiple respective slices (via interleaved TE scanning) before the readout of the echo of the first of these slices, and one echo train comprising multiple echoes is generated per excitation signal ("multiple echo times", multiple echoes).

Figure 3:
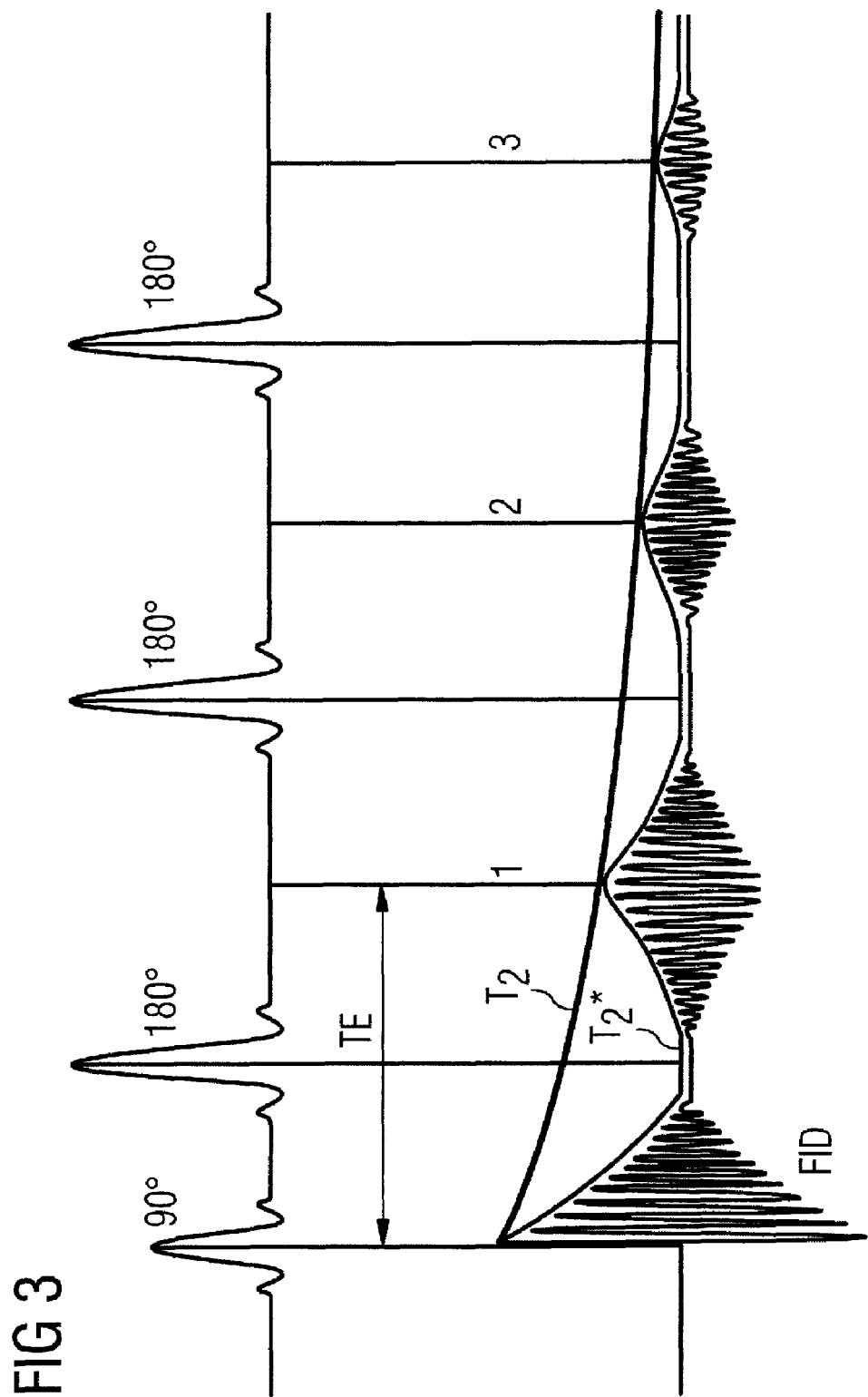
FIG. 3 schematically shows a time diagram for a determination of shim parameters with multiple echo excitation.

FIG. 3 shows as a time diagram for a determination of shim parameters the use of a multiple echo excitation, thus excitation via multiple 180° pulses within the relaxation time T2. After a transversally magnetizing 90° pulse, respective echoes are generated via multiple (at least two, three in FIG. 3) 180° pulses at three points in time (1, 2, 3), which echoes are read out and serve to determine shim parameters (for the respective current patient bed position).

Given a multi-slice acquisition, the image acquisition time alone would be too long for a fast B0 field determination; given a flux density of 1.5 T the first two in-phase echoes are available after 4.76 ms and 9.52 ms. TR-min is therefore 12 ms for 3 slices and a matrix with 56 phase coding steps, which leads to a total acquisition time of 2 s.

Combined with the desired measurement at intervals of 30 mm (on the travel path of the patient bed), this leads to a speed of the patient bed of 15 mm/second or 67 s for a path of 1 meter traveled by the patient bed. The method according to the invention is thus faster by almost a factor of 3 in this case.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for measuring field inhomogeneities and setting shim parameters of a magnetic resonance apparatus, comprising the steps of:
    moving a patient, having an examination region from which magnetic resonance data are to be acquired, on a displaceable bed through an imaging region of a magnetic resonance data acquisition unit by continuous displacement of the patient bed;
    during said continuous displacement of the patient bed and the patient thereon, acquiring information representing field inhomogeneities of a basic magnetic field generated by the data acquisition unit, at multiple positions of the patient bed from respective magnetic resonance signals generated at said positions, by excitation of multiple slices in the examination region before reading out echoes from a first of said multiple slices, with one echo train, comprising multiple echoes, being generated per excitation;
    supplying the measured information to a processor, and in said processor, calculating adjustments to shim parameters of the magnetic resonance apparatus dependent on the measured information, thereby generating adjusted shim parameters at an output of the processor; and
    implementing a magnetic resonance examination of the examination subject to acquire magnetic resonance imaging data therefrom with the magnetic resonance apparatus shimmed according to the adjusted shim parameters.

2. A method as claimed in claim 1 comprising continuously displacing the patient bed with a uniform speed.

3. A method as claimed in claim 1 comprising moving the patient through the imaging region of the magnetic resonance data acquisition unit a first time to acquire said information and moving the patient on the patient bed through the imaging region of the data acquisition unit a second time to acquire said magnetic resonance imaging data.

4. A method as claimed in claim 1 comprising acquiring, as said information representing field inhomogeneities, at least one of a field distribution of the basic magnetic field, a field distribution of radio-frequency fields generated in said excitation, and a field distribution of gradient magnetic fields generated during said excitation, dependent on the position of the patient bed.

5. A method as claimed in claim 1 comprising generating a field map of said basic magnetic field from said information representing field inhomogeneities.

6. A method as claimed in claim 1 comprising storing said information representing field inhomogeneities in a memory associated with respective positions of the patient bed.

7. A method as claimed in claim 1 comprising moving said patient through an imaging region of said magnetic resonance data acquisition unit that is smaller than said examination region of the patient.

8. A magnetic resonance apparatus for measuring field inhomogeneities and setting shim parameters comprising:
    a magnetic resonance data acquisition unit having an imaging region;
    a patient bed adapted to receive a patient thereon, the patient having an examination region from which magnetic resonance data are to be acquired;
    a control unit configured to operate said patient bed to displace the patent bed through an imaging region of the magnetic resonance data acquisition unit by continuous displacement of the patient bed;
    a processor configured to acquire, during said continuous displacement of the patient bed and the patient thereon, information representing field inhomogeneities of a basic magnetic field generated by the data acquisition unit, at multiple positions of the patient bed from respective magnetic resonance signals generated at said positions, by excitation of multiple slices in the examination region before reading out echoes from a first of said multiple slices, with one echo train, comprising multiple echoes, being generated per excitation;
    said processor being configured to calculate adjustments to shim parameters of the magnetic resonance apparatus dependent on the measured information, thereby generating adjusted shim parameters at an output of the processor; and
    shim components in said magnetic resonance data acquisition unit adjusted according to the adjusted shim parameters.

9. A magnetic resonance apparatus as claimed in claim 8 wherein said control unit is configured to continuously displace the patient bed with a uniform speed.

10. A magnetic resonance apparatus as claimed in claim 8 wherein said control unit is configured to move the patient through the imaging region of the magnetic resonance data acquisition unit a first time to acquire said information and move the patient on the patient bed through the imaging region of the data acquisition unit a second time to acquire said magnetic resonance imaging data.

11. A magnetic resonance apparatus as claimed in claim 8 wherein said processor is configured to acquire, as said information representing field inhomogeneities, at least one of a field distribution of the basic magnetic field, a field distribution of radio-frequency fields generated in said excitation, and a field distribution of gradient magnetic fields generated during said excitation, dependent on the position of the patient bed.

12. A magnetic resonance apparatus as claimed in claim 8 wherein said processor is configured to generate a field map of said basic magnetic field from said information representing field inhomogeneities.

13. A magnetic resonance apparatus as claimed in claim 8 wherein said processor is configured to store said information representing field inhomogeneities in a memory associated with respective positions of the patient bed.

14. A magnetic resonance apparatus as claimed in claim 8 wherein said imaging region of said magnetic resonance data acquisition unit is smaller than said examination region of the patient.

* * * * *